(12) United States Patent
Oshio

(10) Patent No.: US 6,377,072 B2
(45) Date of Patent: Apr. 23, 2002

(54) INTERFACE CIRCUIT AND SIGNAL TRANSMISSION METHOD

(75) Inventor: Umeo Oshio, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/734,686

(22) Filed: Dec. 13, 2000

(30) Foreign Application Priority Data

May 23, 2000 (JP) ........................................ 2000-151796

(51) Int. Cl.[7] ........................................... H03K 19/0175
(52) U.S. Cl. ............................ 326/80; 326/62; 326/63; 326/83; 326/86; 326/89; 326/90
(58) Field of Search ........................... 326/75, 80, 81, 326/83, 86, 89, 90, 91, 126, 62, 63

(56) References Cited

U.S. PATENT DOCUMENTS

| | | | | |
|---|---|---|---|---|
| 5,115,148 A | * | 5/1992 | Kammerl et al. | ........... 307/475 |
| 5,115,434 A | * | 5/1992 | Aizaki | ........................ 307/495 |
| 5,680,063 A | * | 10/1997 | Ludwig et al. | ................ 326/80 |
| 5,691,654 A | * | 11/1997 | Green | ......................... 326/80 |
| 6,154,057 A | * | 11/2000 | Shao et al. | .................... 326/80 |

OTHER PUBLICATIONS

Electronic Topic Term Book Page, Apr. 5, 1984, K.K. Omusha (in English and Japanese).
Diagrammatic Introduction to Digital IC Circuit, Aug. 1, 1984, Masamichi Takano (in English and Japanese).

* cited by examiner

*Primary Examiner*—Michael Tokar
*Assistant Examiner*—Khai M. Nguyen
(74) *Attorney, Agent, or Firm*—Arent Fox Kintner Plotkin & Kahn, PLLC

(57) ABSTRACT

Two LSIs are driven with different power supply voltages. An interface circuit which outputs a constant current corresponding to a logic signal to a first LSI and stopping the output of the constant current is provided in the first LSI. An interface circuit which generates a logic signal having a level conforming to the second LSI, based on the constant current, is provided in the second LSI.

5 Claims, 7 Drawing Sheets

INTERFACE CIRCUIT AND SIGNAL TRANSMISSION METHOD

FIELD OF THE INVENTION

The present invention in general relates to an interface circuit used for transmission of logic signals among a plurality of electronic devices. More particularly, this invention relates to an interface circuit and a signal transmission method suitable for use in a plurality of electronic devices having different power supply voltages.

BACKGROUND OF THE INVENTION

As the technique advances, a plurality of electronic devices such as LSIs (Large Scale Integrated circuits) or ICs (Integrated Circuits) are mounted on each electronic apparatus. By conducting transmission and reception of logic signals between these electronic devices, given operation is executed. Recently, however, power supply voltages of a plurality of electronic devices tend to differ according to manufactures. Therefore, there frequently occurs such a situation that the level of the logic signal also differs among a plurality of electronic devices.

Heretofore, therefore, it has been necessary to adjust the level of the logic signal among a plurality of devices. This results in such a state that evil effects attendant upon the adjustment, such as a longer circuit design time and restriction of usable electronic devices, cannot be overlooked. Heretofore, therefore, a measure and method capable of effectively solving such problems have been desired earnestly.

Figure 6:
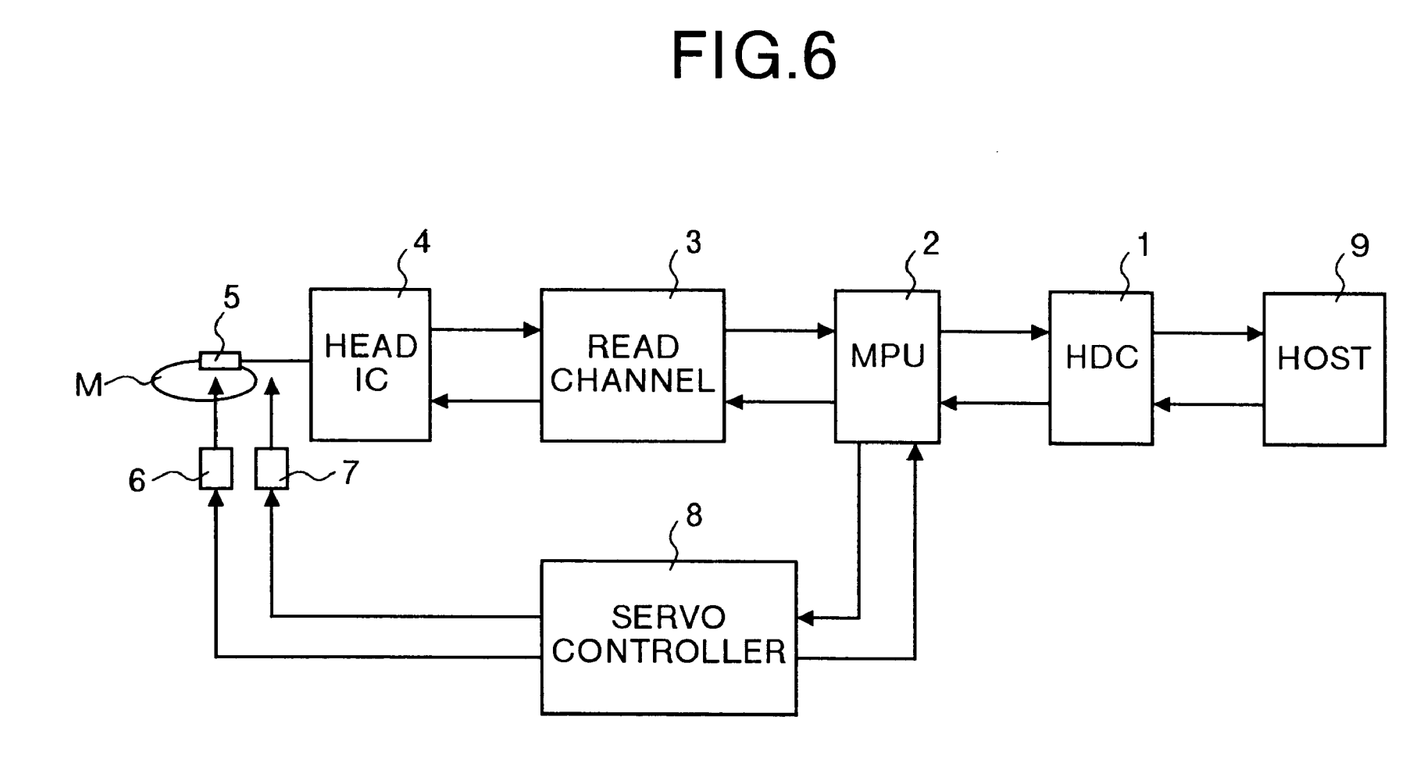
FIG. 6 is a block diagram showing a configuration of a conventional magnetic disk apparatus.

As an example of the above described electronic apparatus having a plurality of electronic devices, a magnetic disk apparatus shown in FIG. 6 will now be described. FIG. 6 is a block diagram showing the configuration of a conventional magnetic disk apparatus. As shown in FIG. 6, in this magnetic disk apparatus, a HDC (hard disk controller) 1 is connected to a host 9 via a SCSI (Small Computer System Interface) bus which is not illustrated. Between the HDC 1 and the host 9 via the SCSI bus, various commands (such as a read command and write command), write data to be written onto a magnetic disk M described later, and read data read out from the magnetic disk M are transmitted and received. The HDC 1 controls components of the magnetic disk apparatus.

A MPU (Micro Processing Unit) 2 controls components of the apparatus. A read/write control and power save control are the major example of such control. A read channel 3 includes a modulation circuit for writing write data onto the magnetic disk M, a parallel/serial conversion circuit for converting parallel write data to serial data, and a demodulation circuit for reading out read data from the magnetic disk M. In addition, the read channel 3 includes a serial/parallel conversion circuit for converting serial read data to parallel data, and a synthesizer circuit for generating timing signals to be used as timing of components of the apparatus by conducting frequency multiplication on the frequency of an oscillation circuit using a crystal oscillator.

A head IC 4 drives a magnetic head 5. The head IC 4 delivers read data fed from the magnetic head 5 to the read channel 3, and delivers write data fed from the read channel 3 to the magnetic head 5. The magnetic head 5 is disposed in close vicinity to the magnetic disk M. The magnetic head 5 has a function of magnetically writing write data onto the magnetic disk M and a function of magnetically reading out read out from the magnetic disk M.

A SPM (spindle motor) 6 drives and rotates the magnetic disk M. A VCM (voice coil motor) 7 moves the magnetic head 5 in the radial direction of the magnetic disk M. A servo controller 8 effects servo control by controlling the SPM 6 and the VCM 7. The HDC 1, MPU 2, read channel 3, head IC 4, and servo controller 8 are electronic devices such as LSIs and ICs, and driven with different power supply voltages.

Figure 7:
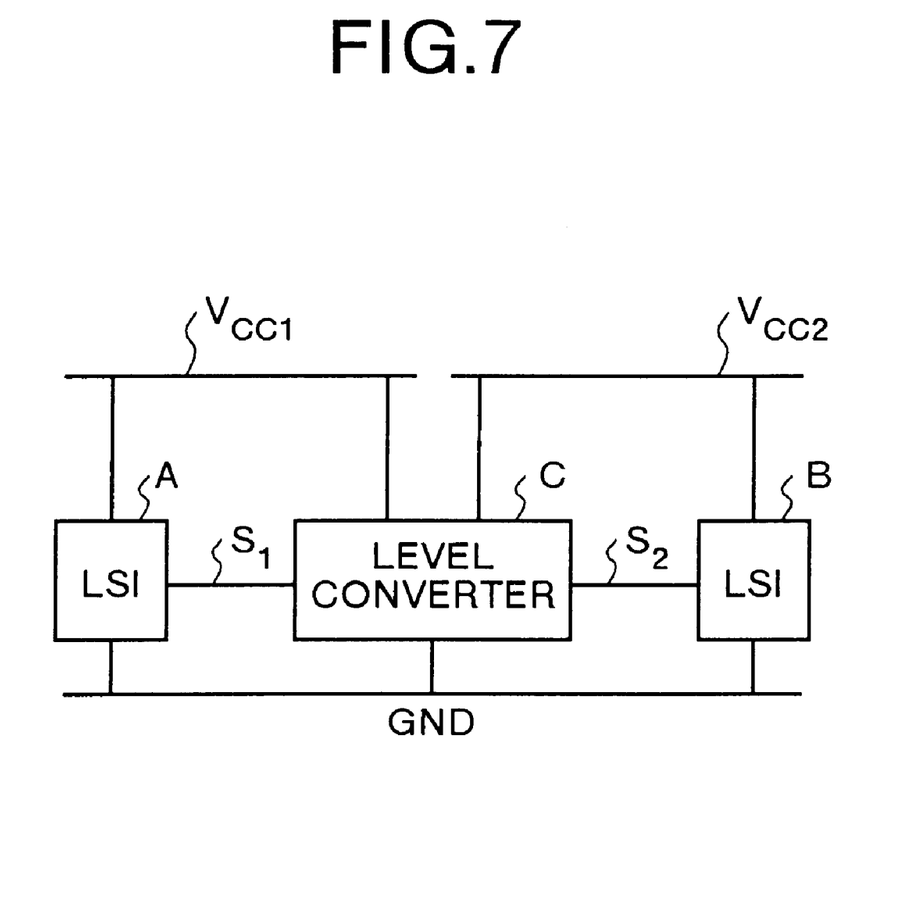
FIG. 7 is a block diagram showing a configuration of a conventional interface circuit.

Therefore, levels of logic signals transmitted and received between these electronic devices also differ depending on electronic devices. In the conventional magnetic disk apparatus, therefore, the level adjustment of logic signals is conducted by an interface circuit shown in FIG. 7. In FIG. 7, an LSI A and an LSI B correspond to two among the HDC 1, the MPU 2, the read channel 3 and so on shown in FIG. 6. The LSI A is driven by a first power supply voltage $V_{cc1}$ (=5.0 V). A logic signal $S_1$ of the LSI A also has a level of 5.0 V.

On the other hand, the LSI B is driven with a second power supply voltage $V_{cc2}$ (=2.5 V) which differs from the first power supply voltage $V_{cc1}$ (=5.0 V). A logic signal $S_2$ of the LSI B also has a level of 2.5 V. That is, the logic signal $S_1$ of the LSI A has a level of 5.0 V, whereas the logic signal $S_2$ of the LSI B has a level of 2.5 V. If the logic signal $S_1$ of 5.0 V is inputted to the LSI B while leaving this state intact, therefore, the logic signal $S_1$ exceeds the breakdown voltage of the LSI B and there is a possibility of the LSI B being destroyed.

In the conventional interface circuit, therefore, there is provided a level converter C for conducting level adjustment of the logic signal between the LSI A and the LSI B. The level converter C converts the logic signal $S_1$ of 5.0 V to the logic signal $S_2$ of 2.5 V conforming to the LSI B. By virtue of the level adjustment conducted by the level converter C, the LSI A and the LSI B normally function.

Thus, the level converter C for conducting the level adjustment of the logic signals must be used in the conventional technique when a plurality of electronic devices driven with different voltages are to be utilized. Therefore, it is necessary to select an electronic device which conforms to the level conversion characteristic of the level converter C. Even if an electronic device is high in performance as a simple substance, therefore, the electronic device cannot be used in the electronic apparatus so long as it does not conform to the level conversion characteristic, in the case of the conventional technique. Therefore, usable electronic devices are restricted naturally. This results in a problem that the circuit design is severely restricted.

Furthermore, if the level converter C is not used, there is a restriction that a plurality of electronic devices which are equal in logic signal level must be selected. This results in a problem that the circuit design time becomes longer by the time required for selection.

SUMMARY OF THE INVENTION

It is an object of the present invention to provide an interface circuit and signal transmission method capable of increasing the degree of freedom of the circuit design using a plurality of electronic devices driven with different voltages and shortening the circuit design time.

In the present invention, a constant current control unit outputs a constant current to the second electronic device, and a logic signal generation unit generates a logic signal having a level conforming to the second electronic device on the basis of the constant current. Thus, logic signal transmission using the constant current is conducted between the first electronic device and the second electronic device, and a logic signal having a level conforming to the second electronic device is generated on the basis of the constant current, in the second electronic device. Accordingly, even if a plurality of electronic devices driven with different power supply voltages are present, the level of the logic signal can be easily conformed. As a result, it becomes possible to increase the degree of freedom of the circuit design and shorten the circuit design time.

Other objects and features of this invention will become apparent from the following description with reference to the accompanying drawings.

DESCRIPTION OF THE PREFERRED EMBODIMENTS

Preferred embodiments of an interface circuit and a signal transmission method according to the present invention will be described by referring to the attached drawing. The present invention is not limited to these embodiments.

Figure 1:
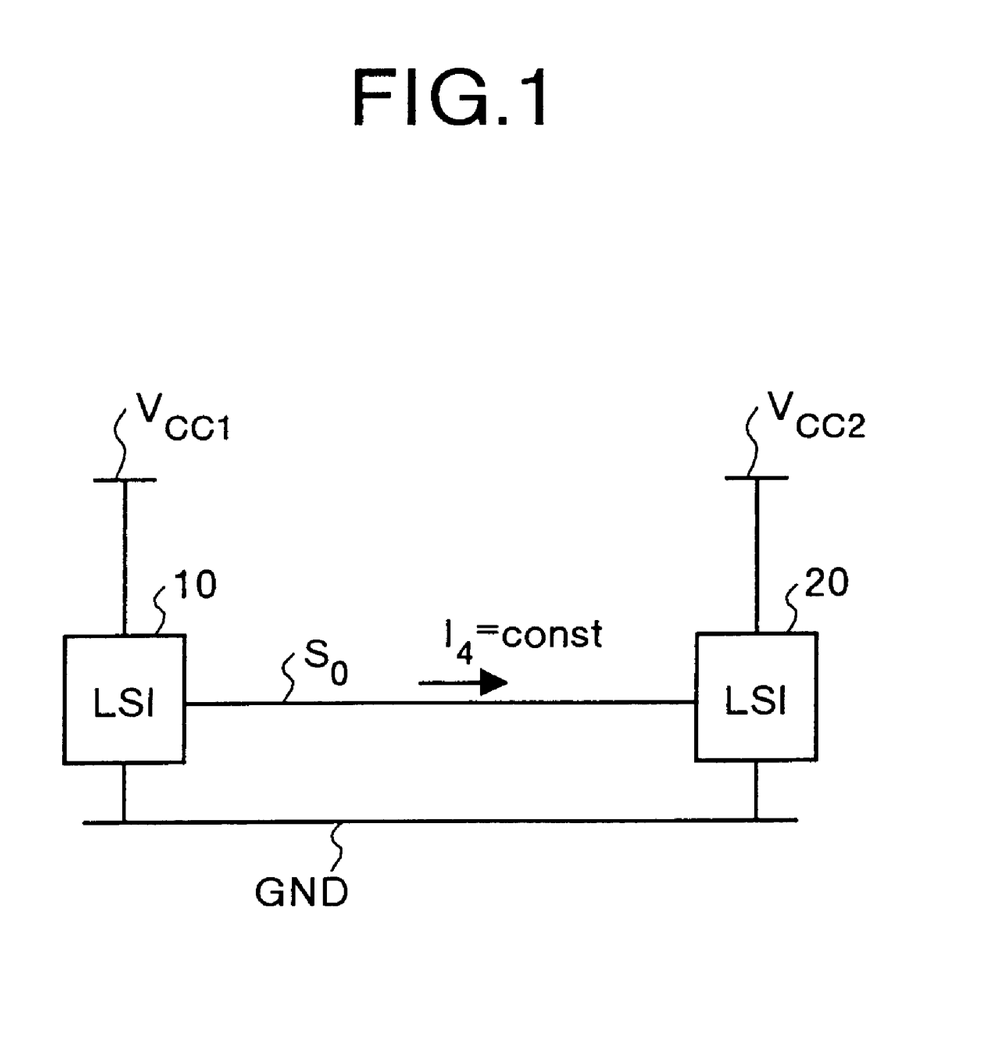
FIG. 1 is a block diagram showing a schematic configuration of a first embodiment according to the present invention.

FIG. 1 is a block diagram showing a schematic configuration according to a first embodiment of the present invention. An LSI 10 and an LSI 20 shown in FIG. 1 are mounted on one electronic apparatus which is not illustrated, and driven with different power supply voltages, respectively. In addition, the LSI 10 is also different from the LSI 20 in logic signal level.

In other words, the LSI 10 is driven with a first power supply voltage $V_{cc1}$ (=5.0 V). The logic signal level of the LSI 10 is also 5.0 V. Within the LSI 10, an interface circuit for sending out a constant current $I_4$ to the LSI 20 is incorporated. When the constant current $I_4$ flows, a logic signal $S_0$ is at a high level. When the constant current $I_4$ does not flow, the logic signal $S_0$ is at a low level.

On the other hand, the LSI 20 is driven with a second power supply voltage $V_{cc2}$ (=2.5 V) which is different from the first power supply voltage $V_{cc1}$ (=5.0 V). The logic signal level of the LSI 20 is also 2.5 V. Within the LSI 10, an interface circuit for generating a logic signal of a level (2.5 V) conforming to the LSI 20 from a constant current $I_4$ is incorporated. In this way, the logic signal level of the LSI 10 is 5.0 V, whereas the logic signal level of the LSI B is 2.5 V.

Figure 2:
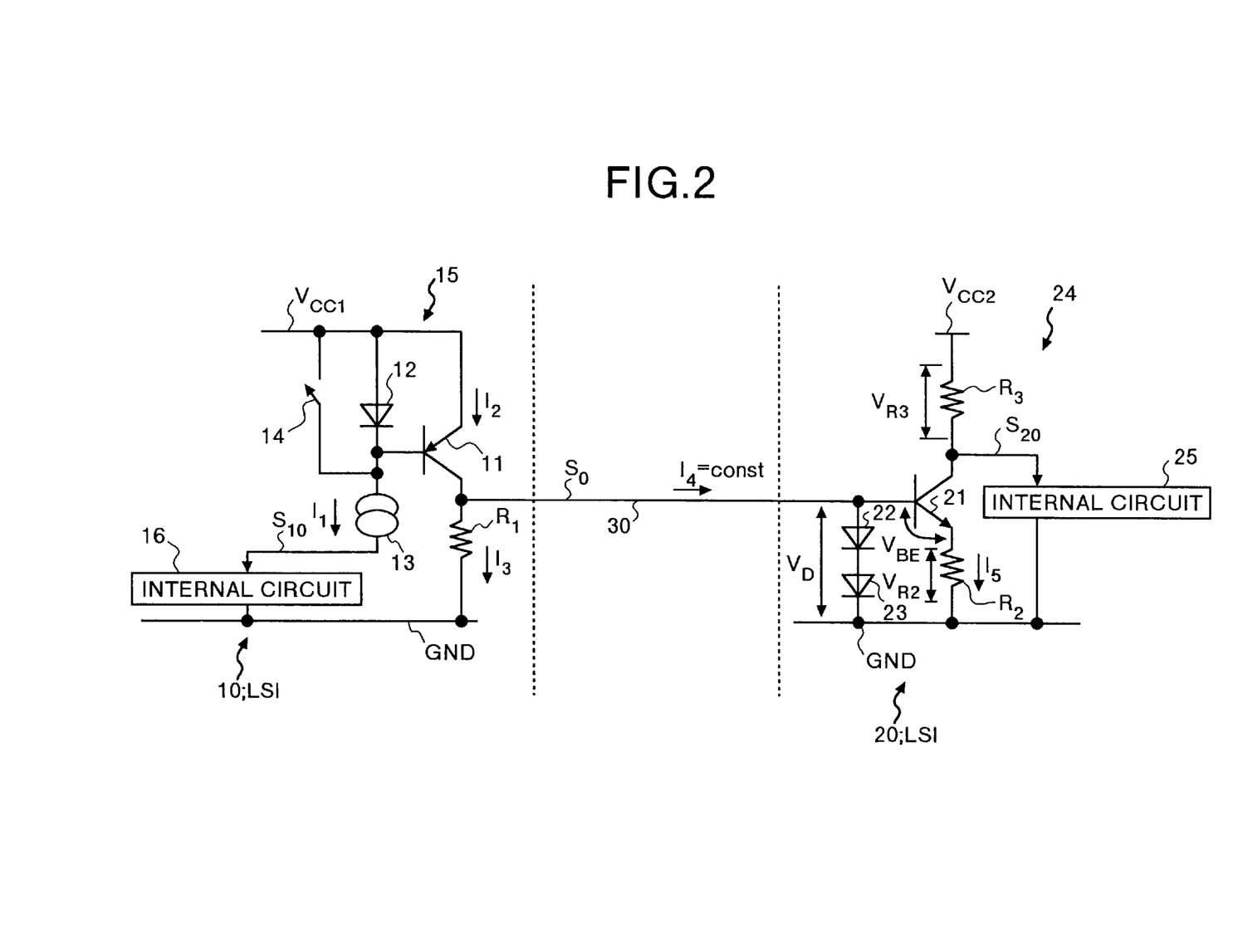
FIG. 2 is a block diagram showing a configuration of the first embodiment according to the present invention.

More detailed configuration of the first embodiment will now be described with reference to FIG. 2. In FIG. 2, components corresponding to those of FIG. 1 are denoted by same legends. The LSI 10 includes an interface circuit 15 and an internal circuit 16. In the interface circuit 15, a transistor 11 is a PNP transistor for effecting on/off control on the output of the constant current $I_4$. This transistor 11 is supplied with the first power supply voltage $V_{cc1}$ at its emitter. A resistor $R_1$ is interposed between a collector of the transistor 11 and ground GND. The resistor $R_1$ has a very large resistance value $r_1$ in order that a constant current $I_2 \approx$ the constant current $I_4$.

A diode 12 is connected between the emitter and base of the transistor 11 in parallel. The diode 12 and the transistor 11 form a current mirror circuit. A constant current $I_1$ flowing through the diode 12 is equal to the constant current $I_2$ flowing through the emitter of the transistor 11. A constant current source 13 is interposed between a cathode of the diode 12 and the internal circuit 16. The constant current source 13 functions to let the constant current $I_1$ flow.

The internal circuit 16 is a circuit for implementing the function of the LSI 10. The internal circuit 16 executes the operation based on a logic signal $S_{10}$. The logic signal $S_{10}$ has a level of 5.0 V. A switch 14 is connected in parallel to the diode 12, and controlled to turn on/off by a control circuit which is not illustrated. A connection line 30 is connected between the LSI 10 and the LSI 20. The connection line 30 serves as a transmission path of the constant current $I_4$ (logic signal $S_0$).

On the other hand, the LSI 20 includes an interface circuit 24 and an internal circuit 25. In the interface circuit 24, a transistor 21 is an NPN transistor which is controlled to turn on/off by the constant current $I_4$. The transistor 21 is supplied at its collector with the second power supply voltage $V_{cc2}$ (=2.5 V) via a resistor $R_3$. The second power supply voltage $V_{cc2}$ (=2.5 V) is different from the first power supply voltage $V_{cc1}$ (=5.0 V) for the LSI 10.

A resistor $R_2$ is interposed between an emitter of the transistor 21 and the ground GND. A diode 22 and a diode 23 form a series circuit. The series circuit is interposed between a base of the transistor 21 and the ground GND. The internal circuit 25 is a circuit for implementing the function of the LSI 20. The internal circuit 25 executes the operation on the basis of a logic signal $S_{20}$. The logic signal $S_{20}$ has a level of 2.5 V ($\neq$ the level of the logic signal $S_{10}$).

If the switch 14 is turned off, then a constant current $I_1$ determined by the constant current source 13 flows through the diode 12, and in addition, the constant current $I_2$ having the same value as the constant current $I_1$ flows through the emitter of the transistor 11 included in the current mirror circuit. The constant current $I_2$ is divided into a constant current $I_3$ flowing through the collector of the transistor 11 and the constant current $I_4$ flowing through the connection line 30. Since the resistance value $r_1$ of the resistor $R_1$ is very large, the current $I_3 \approx 0$. Therefore, it follows that the constant current $I_2 \approx$ constant current $I_4$.

When the constant current $I_4$ flows into the interface circuit 24, a drop voltage $V_D$ ($\approx 1.4$ V) occurs across the series circuit formed of the diodes 22 and 23, and a base-emitter voltage $V_{BE}$ ($\approx 0.7$ V) occurs between the base and the emitter of the transistor 21. As a result, a drop voltage $V_{R2}$ of approximately 0.7 V (=drop voltage $V_D$–base-emitter voltage $V_{BE}$) occurs across a resistor $R_2$, and a current $I_5$ (=drop voltage $V_{R2}$/resistance value $r_2$ of the resistor $R_2$) flows.

At this time, the current $I_5$ flows through the resistor $R_3$ as well. Therefore, a drop voltage $V_{R3}$ (=resistance value $r_3$ of the resistor $R_3 \times$ current $I_5$) occurs across the resistor $R_3$. Accordingly, a logic signal $S_{20}$ of a low level represented as (second power supply voltage $V_{cc2}$–drop voltage $V_{R3}$) is inputted to the internal circuit 25.

In other words, in the first embodiment, the level of the logic signal $S_{20}$ can be conformed to the LSI 20 without using the conventional level converter C (see FIG. 7), by setting the resistance value $r_2$ of the resistor $R_2$ and the resistance value $r_3$ of the resistor $R_3$ to suitable values. The resistors $R_2$ and $R_3$ may be variable resistors. In this case, logic signals of arbitrary levels can be generated. As a result, it becomes easy to mount any electronic devices driven with different power supply voltages on an electronic apparatus.

On the other hand, if the switch 14 is turned on, then the constant current $I_1$ ceases to flow through the diode 12, and consequently it follows that the constant current $I_2=0$. Therefore, the constant current $I_4=0$, and the base voltage of the transistor 21 also becomes 0 V. Since the transistor 21 thus turns off, the second power supply voltage $V_{cc2}$, i.e., a high level logic signal $S_{20}$ is inputted to the internal circuit 25.

As heretofore described, in the first embodiment, logic signal transmission is conducted between the LSI 10 and the LSI 20 by using the constant current $I_4$, and the logic signal $S_{20}$ having the level conforming to the LSI 20 is generated in the LSI 20 on the basis of the constant current $I_4$. Even in a plurality of electronic devices driven with different voltages, therefore, logic signal levels can be conformed simply. As a result, the degree of circuit design can be increased and the circuit design time can be shortened.

Figure 3:
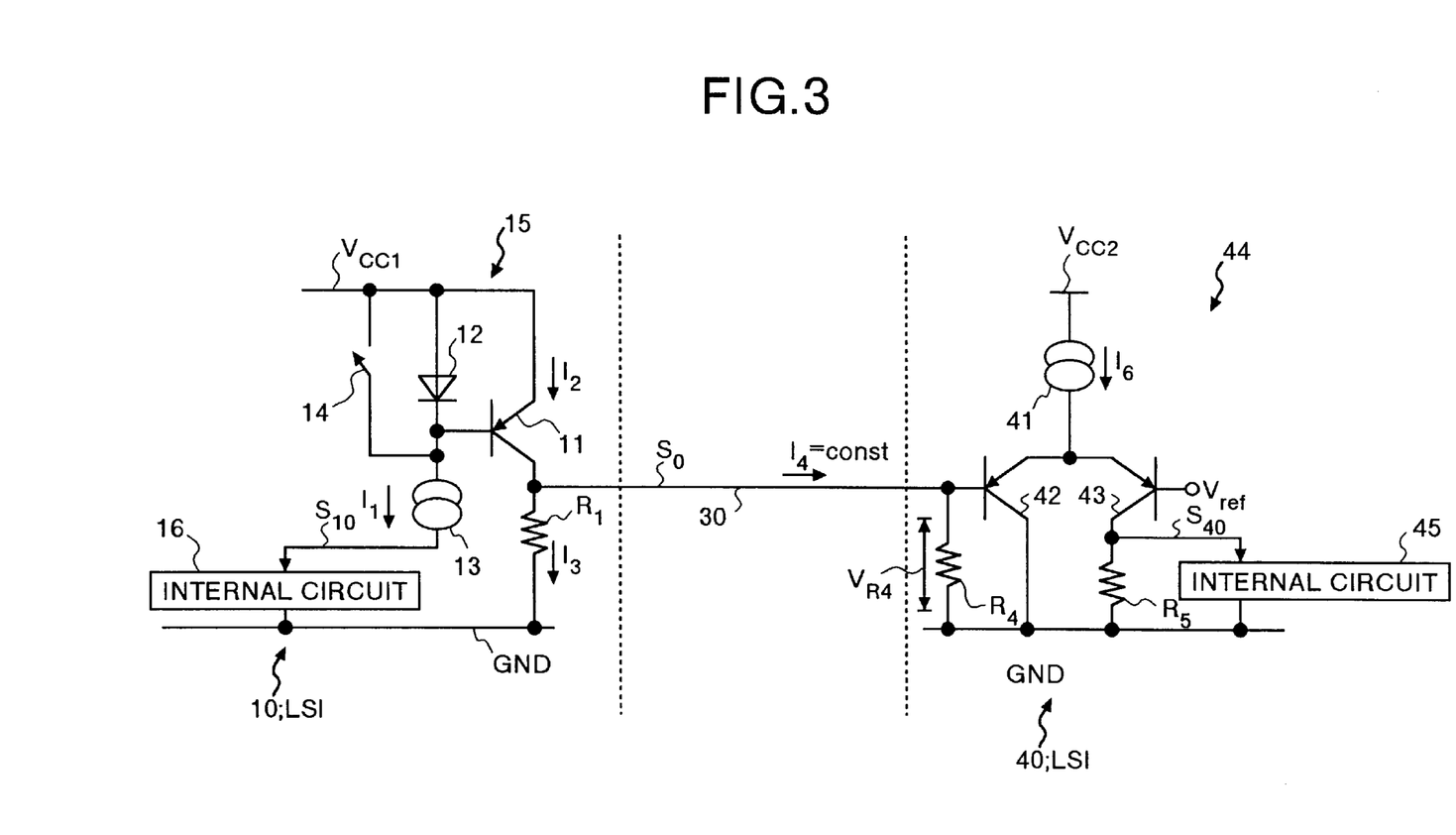
FIG. 3 is a block diagram showing a configuration of a second embodiment according to the present invention.

FIG. 3 is a block diagram showing a configuration of a second embodiment according to the present invention. In FIG. 3, components corresponding to those of FIG. 2 are denoted by same legends. In FIG. 3, an LSI 40 is provided instead of the LSI 20 shown in FIG. 2. The LSI 40 includes an interface circuit 44 and an internal circuit 45.

In the interface circuit 44, a constant current source 41 functions to let a constant current $I_6$ flow. The constant current source 41 is connected to a second power supply voltage $V_{cc2}$. A transistor 42 and a transistor 43 form an ECL (Emitter Coupled Logic) circuit. The transistor 42 is a PNP transistor interposed between the constant current source 41 and the ground GND. The transistor 42 is connected to a connection line 30 at its base, connected to the constant current source 41 at its emitter, and connected to the ground GND at its collector. A resistor $R_4$ is interposed between the base of the transistor 42 and the ground GND.

The transistor 43 is a PNP transistor disposed in parallel to the transistor 42 and interposed between the constant current source 41 and the ground GND. In other words, the transistor 43 is connected at its emitter to the constant current source 41 and the emitter of the transistor 42, and connected at its collector to the ground GND via a resistor $R_5$. The transistor 43 is supplied with a reference voltage $V_{ref}$ at its base. The reference voltage $V_{ref}$ is set to a value obtained by subtracting 0.5 (V) from a drop voltage $V_{R4}$ incurred across the resistor $R_4$. The internal circuit 45 is a circuit for implementing the function of the LSI 40. The internal circuit 45 operates on the basis of a logic signal $S_{40}$. The logic signal $S_{40}$ has a level of 2.5 V ($\neq$level of the logic signal $S_{10}$).

If the switch 14 is turned off, then a constant current $I_1$ determined by the constant current source 13 flows through the diode 12, and in addition, the constant current $I_2$ having the same value as the constant current $I_1$ flows through the emitter of the transistor 11 included in the current mirror circuit. In the same way as the case of the first embodiment, therefore, the constant current $I_4$ ($\approx$constant current $I_2$) flows through the connection line 30.

If the constant current $I_4$ flows into the interface circuit 44, then a drop voltage $V_{R4}$ occurs across a resistor $R_4$. Since the reference voltage $V_{ref}$ is applied to the base of the transistor 43 at this time, the constant current $I_6$ flows through the resistor $R_5$ via the transistor 43 as a result of the function of the ECL circuit. Accordingly, a high level logic signal $S_{40}$ represented as the resistance value $r_5$ of the resistor $R_5 \times$constant current $I_5$ is inputted to the internal circuit 45. In other words, in the second embodiment, the level of the logic signal $S_{40}$ can be conformed to the LSI 40 without using the conventional level converter C (see FIG. 7), by setting the resistance value $r_5$ of the resistor $R_5$ to a suitable value. The resistor $R_5$ may be a variable resistor.

On the other hand, if the switch 14 is turned on, then the constant current $I_1$ ceases to flow through the diode 12, and consequently it follows that the constant current $I_2=0$. Therefore, the constant current $I_4=0$, and the base voltage of the transistor 21 also becomes 0 V. Since all of the constant current $I_6$ flows into the transistor 42, the constant current $I_6$ does not flow through the transistor 43 (resistor $R_5$) In this case, a logic signal $S_{40}$ of a low level (ground GND level) is inputted to the internal circuit 45.

As heretofore described, in the second embodiment, logic signal transmission is conducted between the LSI 10 and the LSI 40 by using the constant current $I_4$, and the logic signal $S_{40}$ having the level conforming to the LSI 20 is generated in the LSI 40 on the basis of the constant current $I_4$. Even in a plurality of electronic devices driven with different voltages, therefore, logic signal levels can be conformed simply. As a result, the degree of circuit design can be increased and the circuit design time can be shortened.

With reference to the first embodiment, there has been made description to the effect that the constant current $I_4$ ceases to flow when the switch 14 shown in FIG. 2 is turned on. As a matter of fact, however, an attenuation time depending on circuit constants occurs until the constant current $I_4$ attenuates to 0. This attenuation time becomes a factor which aggravates the response characteristic. Therefore, it is desirable to shorten the attenuation time as short as possible and thereby improve the response characteristic. Hereafter, this case will be described as a third embodiment.

Figure 4:
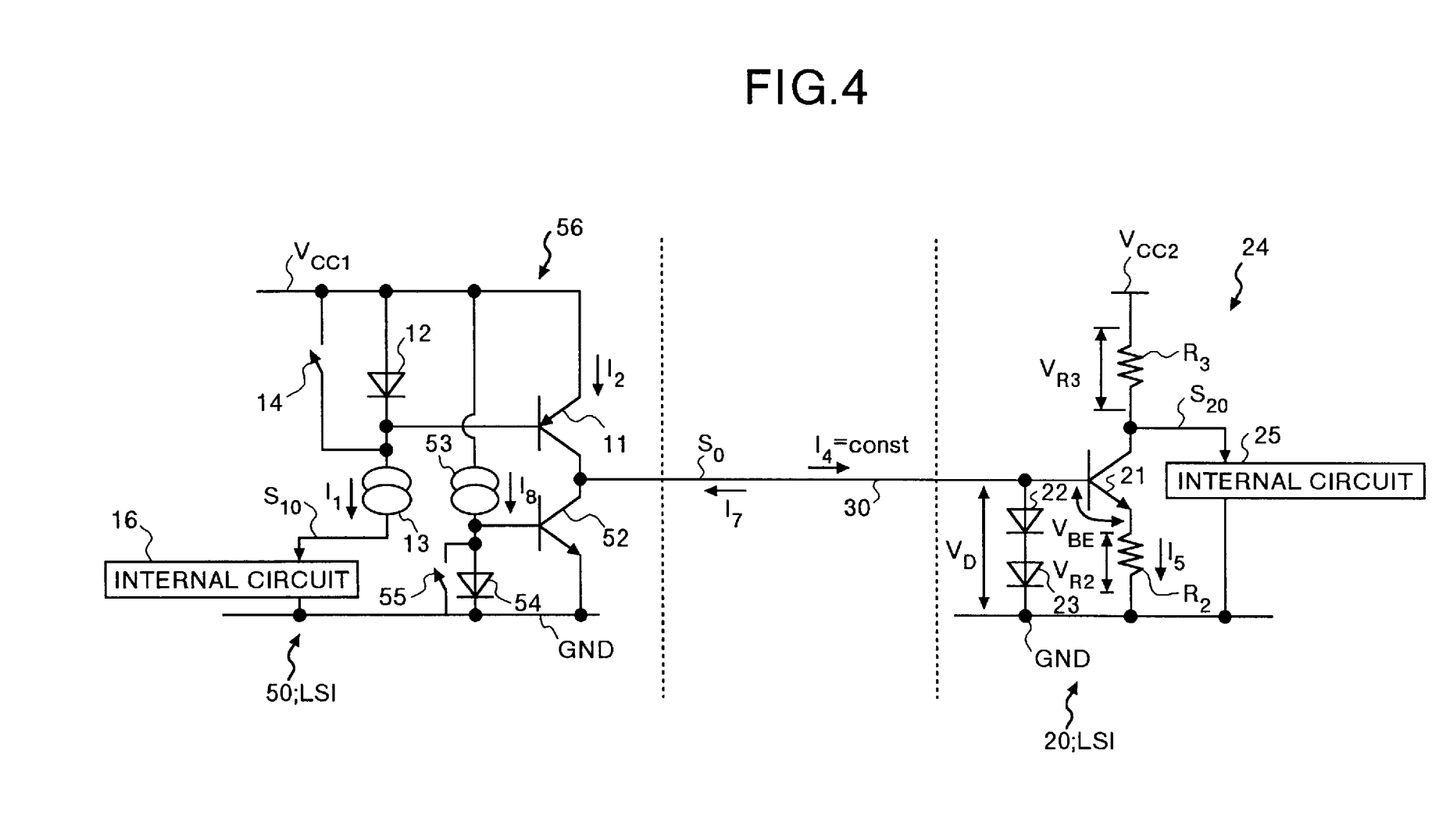
FIG. 4 is a block diagram showing a configuration of a third embodiment according to the present invention.

FIG. 4 is a block diagram showing a configuration of a third embodiment according to the present invention. In FIG. 4, components corresponding to those of FIG. 2 are denoted by same legends. In FIG. 4, an LSI 50 is provided instead of the LSI 10 shown in FIG. 2. The LSI 50 includes an interface circuit 56 and an internal circuit 16. In the interface circuit 56, a transistor 52, a constant current source 53, a diode 54, and a switch 55 are provided instead of the resistor $R_1$ shown in FIG. 2.

The transistor 52 is an NPN transistor for shortening the attenuation time of the constant current $I_4$. The transistor 52 is connected at its collector to the collector of the transistor 11, and connected at its emitter to the ground GND. The constant current source 53 functions to let a constant current $I_8$ flow. The diode 54 is interposed between the constant current source 53 and the ground GND. The diode 54 and the transistor 52 form a current mirror circuit. The switch 55 is connected in parallel to the diode 54 and controlled to turn on/off by a control circuit which is not illustrated. The switch 14 and the switch 55 are turned on/off by inverse logics.

If the switch 14 is turned off and the switch 55 is turned on in the above described configuration, then the constant current $I_1$ determined by the constant current source 13 flows through the diode 12, and in addition, a constant current $I_2$ having the same value as the constant current $I_1$ flows through the emitter of the transistor 11 included in the current mirror circuit. Through the connection line 30, therefore, the constant current $I_4$ (≈constant current $I_2$) flows. On the other hand, since the switch 55 is in the on-state, the constant current $I_8$ flows through the switch 55, but it does not flow through the diode 54.

Therefore, no current flows through the transistor 52 included in the current mirror circuit. Accordingly, the transistor 52 is turned off. If thereafter the constant current $I_4$ flows into the LSI 20, then operation similar to the operation of the first embodiment described earlier is conducted.

If the switch 14 is turned on and the switch 55 is turned off, then the constant current $I_1$ ceases to flow through the diode 12. On the other hand, since the switch 55 is in the off state, the constant current $I_8$ flows through the diode 54 and consequently the transistor 52 turns on. Therefore, a sink constant current $I_7$ flows through the connection line 30 in a direction opposite to that of the constant current $I_4$. As a result, the constant current $I_4$ is canceled by the sink constant current $I_7$ and attenuated rapidly.

As heretofore described, in the third embodiment, the transistor 52, the constant current source 53, and the switch 55 are provided, and the sink constant current $I_7$ is let flow in the direction opposite to that of the constant current $I_4$. Therefore, the attenuation time of the constant current $I_4$ can be shortened. As a result, the response characteristic can be improved.

With reference to the third embodiment, there has been described an example in which the means for letting the sink constant current $I_7$ shown in FIG. 4 flow are provided to improve the response characteristic between the LSI 50 and the LSI 20. This may be applied to the second embodiment. Hereafter, this case will be described as a fourth embodiment.

Figure 5:
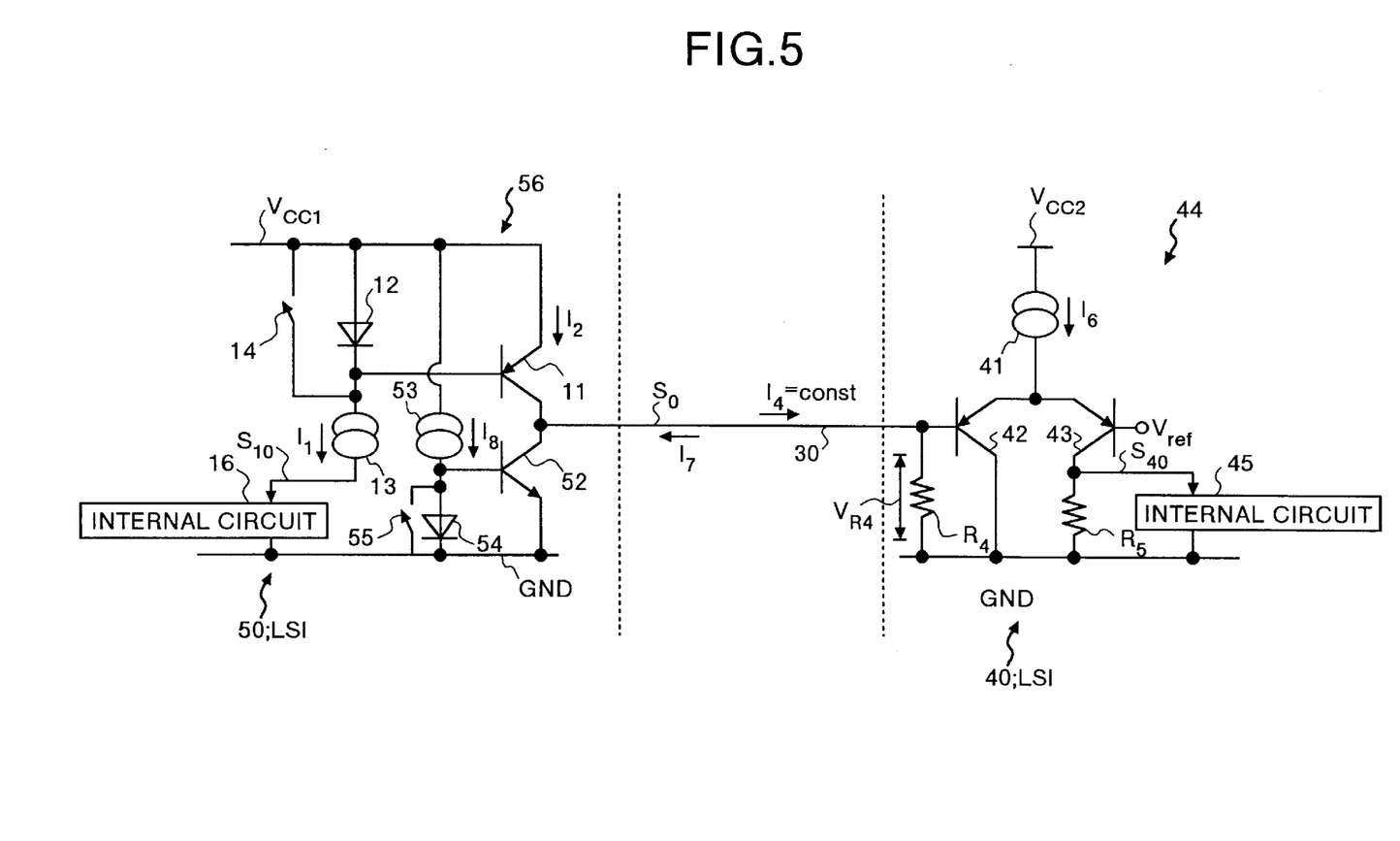
FIG. 5 is a block diagram showing a configuration of a fourth embodiment according to the present invention.

FIG. 5 is a block diagram showing a configuration of the fourth embodiment. In FIG. 5, components corresponding to those of FIG. 4 are denoted by same legends. In FIG. 5, the LSI 40 (see FIG. 3) is provided instead of the LSI 20 shown in FIG. 4. Operation of flow of the sink constant current $I_7$ shown in FIG. 5 and effects of the sink constant current $I_7$ are similar to those of the third embodiment, and consequently description of them will be omitted.

According to the present invention, logic signal transmission using the constant current is conducted between the first electronic device and the second electronic device, and a logic signal having a level conforming to the second electronic device is generated on the basis of the constant current, in the second electronic device, as heretofore described. Even in a plurality of electronic devices driven with different power supply voltages, therefore, the level of the logic signal can be conformed simply. This brings about an effect that it becomes possible to increase the degree of freedom of the circuit design and shorten the circuit design time.

Further, a sink constant current is let flow in a direction opposite to that of the constant current. This brings about an effect that the attenuation time is shortened and consequently the response characteristic can be improved.

Further, a logic signal conforming to the second electronic device is generated by an extremely simple element, i.e., a resistor. This brings about an effect that the circuit design time can be further shortened.

Further, the resistor is a variable resistor. Accordingly, a logic signal having an arbitrary level can be generated. This brings about an effect that it becomes easy to mount any electronic devices driven with different power supply voltages on an electronic apparatus.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An interface circuit interposed between a first electronic device and a second electronic device driven with different power supply voltages, respectively, said interface circuit comprising:

a constant current control unit, disposed in said first electronic device, which outputs a constant current corresponding to a logic signal to said second electronic device and also stops the output of the constant current; and a logic signal generation unit, disposed in said second electronic device, which generates a logic signal having a level conforming to said second electronic device, based on said constant current fed from said constant current control unit.

2. The interface circuit according to claim 1 further comprising a sink constant current control unit, disposed in said first electronic device, which lets a sync constant current flow in a direction opposite to that of said constant current, when the output of the constant current is stopped.

3. The interface circuit according to claim 1, wherein said logic signal generation unit generates the logic signal by using a resistor corresponding to a level which conforms to said second electronic device.

4. The interface circuit according to claim 3, wherein said resistor is a variable resistor and sets a resistance value according to the level of the logic signal.

5. A signal transmission method of conducting signal transmission between a first electronic device and a second electronic device driven with different power supply voltages, respectively, said signal transmission method comprising the steps of:

outputting a constant current corresponding to a logic signal from said first electronic device to said second electronic device, and stopping the output of said constant current; and generating a logic signal having a level conforming to said second electronic device, in said second electronic device.

* * * * *